(12) United States Patent
Czaplewski et al.

(10) Patent No.: US 10,327,336 B2
(45) Date of Patent: *Jun. 18, 2019

(54) DRY FILM SOLDER MASK COMPOSITE LAMINATE MATERIALS

(71) Applicant: International Business Machines Corporation, Armonk, NY (US)

(72) Inventors: Sarah K. Czaplewski, Rochester, MN (US); Joseph Kuczynski, North Port, FL (US); Jason T. Wertz, Pleasant Valley, NY (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

This patent is subject to a terminal disclaimer.

(21) Appl. No.: 14/735,395

(22) Filed: Jun. 10, 2015

(65) Prior Publication Data
US 2016/0338196 A1  Nov. 17, 2016

Related U.S. Application Data

(63) Continuation of application No. 14/710,956, filed on May 13, 2015, now Pat. No. 9,545,011.

(51) Int. Cl.
*B32B 27/08* (2006.01)
*B32B 27/00* (2006.01)
(Continued)

(52) U.S. Cl.
CPC ............ *H05K 3/0064* (2013.01); *H05K 1/09* (2013.01); *H05K 3/0073* (2013.01); *H05K 3/3452* (2013.01); *H05K 3/225* (2013.01); *H05K 3/281* (2013.01); *H05K 3/34* (2013.01); *H05K 2201/0195* (2013.01)

(58) Field of Classification Search
None
See application file for complete search history.

(56) References Cited

U.S. PATENT DOCUMENTS 3,435,003 A 3/1969 Craven
4,246,147 A 1/1981 Bakos et al.
(Continued)

FOREIGN PATENT DOCUMENTS

CA 1219961 A 3/1987
CA 1219961 A1 3/1987
(Continued)

OTHER PUBLICATIONS

Circuitmedic, 4 Techniques for Removing Solder Mask, Apr. 19, 2012. https://web.archive.org/web/20120419082407/http://www.circuitmedic.com/features/514.shtml.*
(Continued)

*Primary Examiner* — Coris Fung
(74) *Attorney, Agent, or Firm* — Patterson + Sheridan, LLP

(57) ABSTRACT

In an example, a dry film solder mask (DFSM) composite laminate material is disclosed. The DFSM composite laminate material includes a printed circuit board (PCB) laminate material, a cyclic compound chemically bonded to the PCB laminate material, and a DFSM material. The DFSM material is reversibly bonded to the PCB laminate material via the cyclic compound.

19 Claims, 6 Drawing Sheets

(51) Int. Cl.
  *B32B 27/38* (2006.01)
  *H05K 3/00* (2006.01)
  *H05K 1/09* (2006.01)
  *H05K 3/34* (2006.01)
  *H05K 3/22* (2006.01)
  *H05K 3/28* (2006.01)

(56) References Cited

U.S. PATENT DOCUMENTS

| | | | |
|---|---|---|---|
| 4,273,909 A | | 6/1981 | Arco |
| 4,687,812 A | | 8/1987 | Dickie et al. |
| 5,380,387 A | | 1/1995 | Salamon et al. |
| 5,641,856 A | | 6/1997 | Meurs |
| 5,840,215 A | | 11/1998 | Iyer et al. |
| 5,910,341 A | * | 6/1999 | Fey ............... C08J 7/123 257/E21.505 |
| 5,912,282 A | | 6/1999 | Iyer et al. |
| 6,136,499 A | | 10/2000 | Goodall et al. |
| 6,246,124 B1 | * | 6/2001 | Jimarez ............ H01L 21/563 257/772 |
| 6,337,384 B1 | | 1/2002 | Loy et al. |
| 6,825,315 B2 | * | 11/2004 | Aubert ............. C08G 73/12 521/135 |
| 7,989,266 B2 | | 8/2011 | Borthakur et al. |
| 9,545,011 B2 | | 1/2017 | Czaplewski et al. |
| 2009/0081377 A1 | | 3/2009 | Kubo |

FOREIGN PATENT DOCUMENTS

| | | |
|---|---|---|
| CN | 85103290 A | 10/1986 |
| CN | 102732159 A | 10/2012 |
| CN | 202555542 U | 11/2012 |
| CN | 102732159 B | 4/2014 |
| JP | 2001506805 A | 5/2001 |
| JP | 2002501554 A | 1/2002 |
| JP | 2002503263 A | 1/2002 |
| JP | 2008216876 A | 9/2008 |
| JP | 2009111263 A | 5/2009 |
| KR | 1020140026037 | 3/2014 |
| KR | 1020140026037 A | 3/2014 |
| TW | I358108 B | 2/2012 |
| TW | I358108 B | 2/2012 |
| WO | 9827160 A1 | 6/1998 |
| WO | 9827177 A1 | 6/1998 |
| WO | 9827178 A1 | 6/1998 |

OTHER PUBLICATIONS

Gandini et al., Polymers from Plant Oil—Chapter 7: Diels-Alder Reactions and Polycondensations Applied to Vegetable Oils and their Derivatives, Mar. 30, 2015. Smithers Rapra, pp. 135-144.*
International Business Machines Corporation, List of IBM Patent or Patent Applications Treated as Related, for U.S. Appl. No. 14/735,395, filed Jun. 10, 2015.

* cited by examiner

US 10,327,336 B2

DRY FILM SOLDER MASK COMPOSITE LAMINATE MATERIALS

I. CROSS REFERENCE TO RELATED APPLICATIONS

This application is a continuation application and claims priority from U.S. patent application Ser. No. 14/710,956, entitled "DRY FILM SOLDER MASK COMPOSITE LAMINATE MATERIALS," filed on May 13, 2015, which is incorporated herein in its entirety.

II. FIELD OF THE DISCLOSURE

The present disclosure relates generally to dry film solder mask (DFSM) composite laminate materials.

III. BACKGROUND

During printed circuit board (PCB) manufacturing, a solder mask may be utilized to protect copper traces from oxidation and to prevent solder bridges from forming between solder pads. The solder mask may be made from epoxy-based materials and may either be silkscreened on or vacuum laminated by using a dry film solder mask (DFSM). During processing of the PCB with the solder mask, the solder mask may become misaligned. In some cases, a misaligned solder mask may be corrected via grinding/scraping, machining/milling, chemical stripping, microblasting, or a combination thereof. Each of these misalignment correction methods may cause damage to an underlying laminate material.

IV. SUMMARY OF THE DISCLOSURE

According to an embodiment, a process for forming a dry film solder mask (DFSM) composite laminate material is disclosed. The process includes applying a first DFSM material to a printed circuit board (PCB) laminate material. The first DFSM material includes a diene functional group, and the PCB laminate material includes a dienophile functional group. The process also includes forming a DFSM composite laminate material by (reversibly) bonding the first DFSM material to the PCB laminate material via a chemical reaction of the diene functional group with the dienophile functional group.

According to another embodiment, a DFSM composite laminate material is disclosed. The DFSM composite laminate material includes a PCB laminate material, a cyclic compound, and a DFSM material. The cyclic compound is chemically bonded to the PCB laminate material, and the DFSM material is reversibly bonded to the PCB laminate material via the cyclic compound.

According to another embodiment, a printed circuit board is disclosed. The printed circuit board includes a PCB substrate and a DFSM composite laminate material overlying the PCB substrate. The DFSM composite laminate material includes a PCB laminate material, a cyclic compound, and a DFSM material. The PCB laminate material is bonded to a surface of the PCB substrate, the cyclic compound is chemically bonded to the PCB laminate material, and the DFSM material is reversibly bonded to the PCB laminate material via the cyclic compound.

One advantage of the present disclosure is the ability to rework a misaligned dry film solder mask without aggressive techniques such as solvent(s), machining, or scraping. Another advantage of the present disclosure is the ability to reapply solder mask material without obtaining additional solder mask material. A further advantage of the present disclosure is that a dry film solder mask can be reworked locally by cutting a section, removing/sliding the cut section, and re-curing.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

V. BRIEF DESCRIPTION OF THE DRAWINGS

VI. DETAILED DESCRIPTION

The present disclosure relates to dry film solder mask (DFSM) composite laminate materials and methods of forming DFSM composite laminate materials. The DFSM composite laminate materials of the present disclosure include a DFSM material (reversibly) bonded to a printed circuit board (PCB) laminate material. The DFSM composite laminate materials of the present disclosure may be applied (e.g., vacuum laminated) to a PCB substrate of a printed circuit board.

In the present disclosure, a material that is used as a PCB laminate material (e.g., a PCB laminate epoxy resin) may be modified for use with a modified DFSM material in order to allow a solder mask to have both adhesion and dehesion properties. The adhesion properties allow the solder mask to be applied to the PCB laminate material, and the dehesion properties allow the solder mask to be reworked without the use of aggressive techniques.

In the present disclosure, a diene functional group of a modified DFSM material may chemically react with a dienophile functional group of a modified PCB laminate material to bond the DFSM material to the PCB laminate material. In some cases, Diels-Alder chemistry may be used such that the DFSM material is reversibly bonded to the PCB laminate material (e.g., via a cyclic compound that is formed in a Diels-Alder reaction of an alkene functional group with a diene functional group). The reversible nature of the chemical reaction to bond the DFSM material to the PCB laminate material may allow the DFSM material to be removed in order to be reworked (e.g., to relocate a misaligned DFSM material or to apply another DFSM material). Thus, if a DFSM material is misaligned or there is a desire to replace the DFSM material, the DFSM material can be de-bonded from the PCB laminate material (e.g., via a retro Diels-Alder reaction).

As an illustrative example, a PCB laminate epoxy resin may be functionalized with a dienophile material and used to create a pre-impregnated material (a "pre-preg" material). The solder mask material may be functionalized to include a diene functional group. When in contact with the modified PCB laminate material, the diene functional group of the modified solder mask material reacts with the dienophile functional group of the modified PCB laminate material to covalently bond the two materials together (e.g., via a Diels-Alder reaction). In order to rework the solder mask, the reaction can undergo a retro Diels-Alder reaction and subsequently be removed/repositioned then cooled to reform the bonds between the two materials. After proper positioning, the solder mask can be vacuum laminated to the printed circuit board and processed. Further, in some cases, the solder mask may be reworked after vacuum lamination as the temperature may not exceed about 60° C.

Figure 1:
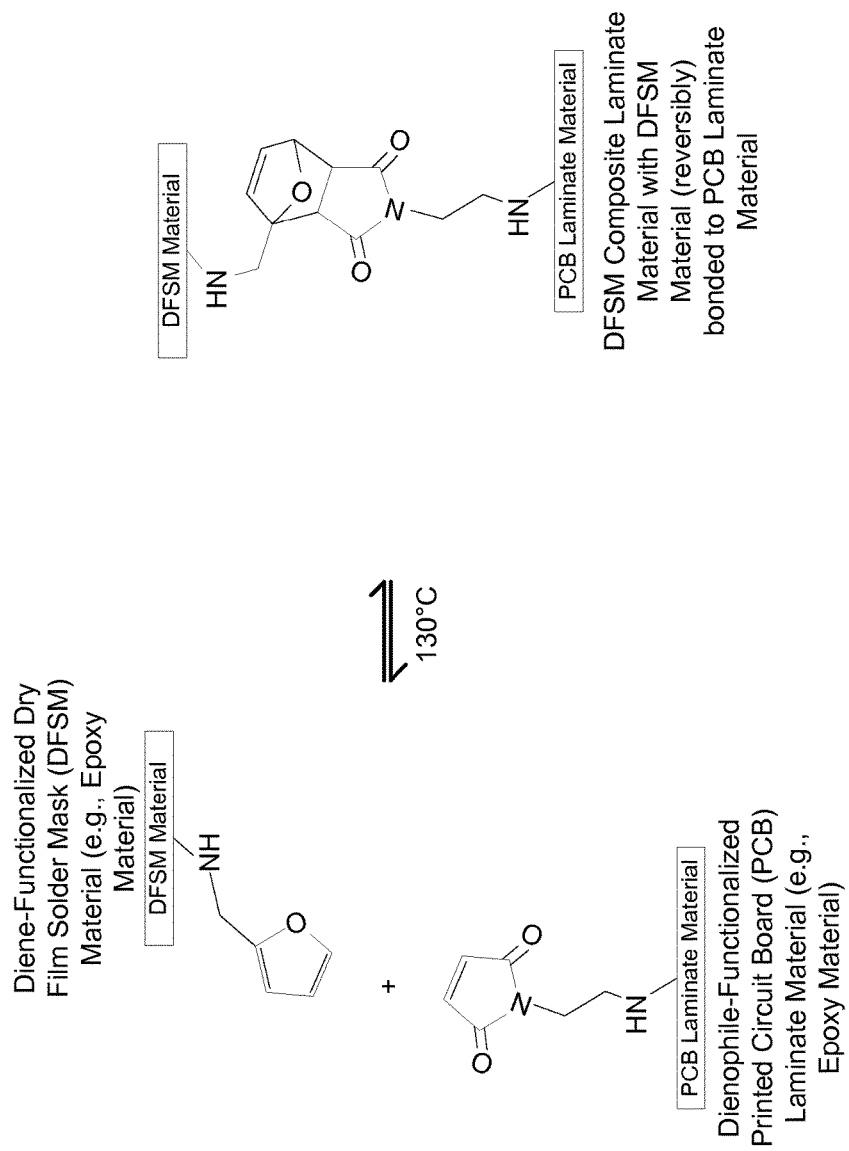
FIG. 1 is a chemical reaction diagram showing the preparation of a dry film solder mask (DFSM) composite laminate material, according to one embodiment.

Referring to FIG. 1, a chemical reaction diagram 100 illustrates the preparation of a DFSM composite laminate material with a DFSM material (reversibly) bonded to a PCB laminate material, according to one embodiment. FIG. 1 illustrates that the DFSM composite laminate material may be formed via a chemical reaction of a functional group of a modified DFSM material and a functional group of a modified PCB laminate material to bond the two materials together. As described further herein with respect to FIG. 2, a DFSM material may be modified to form the modified DFSM material (that includes a diene functional group) that is illustrated in FIG. 1. As described further herein with respect to FIG. 3, a PCB laminate material may be modified to form the modified PCB laminate material (that includes a dienophile functional group) that is illustrated in FIG. 1. In the example DFSM composite laminate material illustrated in FIG. 1, the DFSM material is (reversibly) bonded to the PCB laminate material via a chemical reaction of the diene functional group with the dienophile functional group. As further described herein with respect to FIG. 4, the DFSM composite laminate material of FIG. 1 may be applied (e.g., via vacuum lamination) to a PCB substrate of a printed circuit board. Additionally, as described further herein with respect to FIG. 6, the reversible nature of the chemical reaction may allow the DFSM material to be reworked (e.g., before or after vacuum lamination of the DFSM composite laminate material to the PCB substrate).

In the example of FIG. 1, the left side of the chemical reaction diagram 100 illustrates a diene-functionalized DFSM material and a dienophile-functionalized PCB laminate material. In the particular embodiment illustrated in FIG. 1, the DFSM material and the PCB laminate material are epoxy materials (e.g., the same or different epoxy resins). The right side of the chemical reaction diagram 100 illustrates that a chemical reaction of a diene functional group of the modified DFSM material with the dienophile functional group of the modified PCB laminate material results in formation of a DFSM composite laminate material. Thus, FIG. 1 illustrates an example of a DFSM composite laminate material with a DFSM material that is (reversibly) bonded to a PCB laminate material (e.g., via a cyclic compound). While FIG. 1 illustrates a single diene functional group for the DFSM material and a single dienophile functional group for the PCB laminate material, it will be appreciated that this is for illustrative purposes only.

FIG. 1 illustrates that, in some cases, the chemical reaction of the diene functional group (of the modified DFSM material) with the dienophile functional group (of the modified PCB laminate material) may be a reversible reaction to reversibly bond the DFSM material to the PCB laminate material. In FIG. 1, the left side of the chemical reaction diagram 100 and the right side of the chemical reaction diagram 100 are separated by a forward arrow and a reverse arrow to indicate that the chemical reaction is a reversible reaction. In the particular embodiment illustrated in FIG. 1, a Diels-Alder reaction drives the reaction in a forward direction, and a retro Diels-Alder reaction drives the reaction in a reverse direction.

In the example illustrated in FIG. 1, the right side of the chemical reaction diagram 100 illustrates that the DFSM material is reversibly bonded to the PCB laminate material via a cyclic compound (e.g., a bicyclic compound). In FIG. 1, the dienophile functional group of the dienophile-functionalized PCB laminate material is an alkene functional group (e.g., a cyclic alkene functional group). The chemical reaction of the alkene functional group with the diene functional group (e.g., a cyclic diene functional group) of the diene-functionalized DFSM material results in formation of the bicyclic compound.

FIG. 1 illustrates a prophetic example in which the reaction may be reversed by heating (e.g., above about 130° C.) for a particular period of time to reverse the Diels-Alder reaction, allowing the DFSM material to detach from the PCB laminate material of the DFSM composite laminate material. As further described herein with respect to FIG. 6, reversibly bonding the DFSM material to the PCB laminate material may allow the DFSM material to be de-bonded from the PCB laminate material (e.g., to relocate a DFSM material that is misaligned with respect to a PCB substrate or to apply a second DFSM material).

Prophetic Example: Synthesis of DFSM Composite Laminate Material

As a prophetic example, the DFSM material may be adhered to the PCB laminate material via covalent bonding using Diels-Alder chemistry. For example, the diene-functionalized DFSM material may be applied to the dienophile-functionalized PCB laminate material. As further described herein with respect to FIG. 3, a furan protected maleic anhydride may be de-protected when heated to a particular temperature (e.g., above about 125° C., such as about 130° C.). In the Diels-Alder chemistry illustrated in FIG. 1, the furan has been removed as a result of heating. After blending, a temperature may be reduced (e.g., to about 70° C.) for a time period of about 2 hours in order to allow the forward reaction to occur. The DFSM composite laminate material product with adhered DFSM material may be cooled (e.g., to room temperature) and excess reactants removed.

Thus, FIG. 1 illustrates an example of a DFSM composite laminate material that includes a PCB laminate material (e.g., a PCB epoxy resin) and a DFSM material (e.g., the same epoxy material or a different epoxy material) that is bonded to the PCB laminate material. In FIG. 1, the DFSM material may be (reversibly) bonded to the PCB laminate material via a cyclic compound that is formed as a result of a chemical reaction of a diene functional group with a dienophile functional group (e.g., via a Diels-Alder reaction). In the reversible reaction illustrated in FIG. 1, the DFSM material may be de-bonded from the PCB laminate material via a non-aggressive technique (e.g., via a retro Diels-Alder reaction). As described further herein with respect to FIG. 6, de-bonding the DFSM material may allow the DFSM material to be reworked (e.g., to correct solder mask misalignment or to replace solder mask material).

Figure 2:
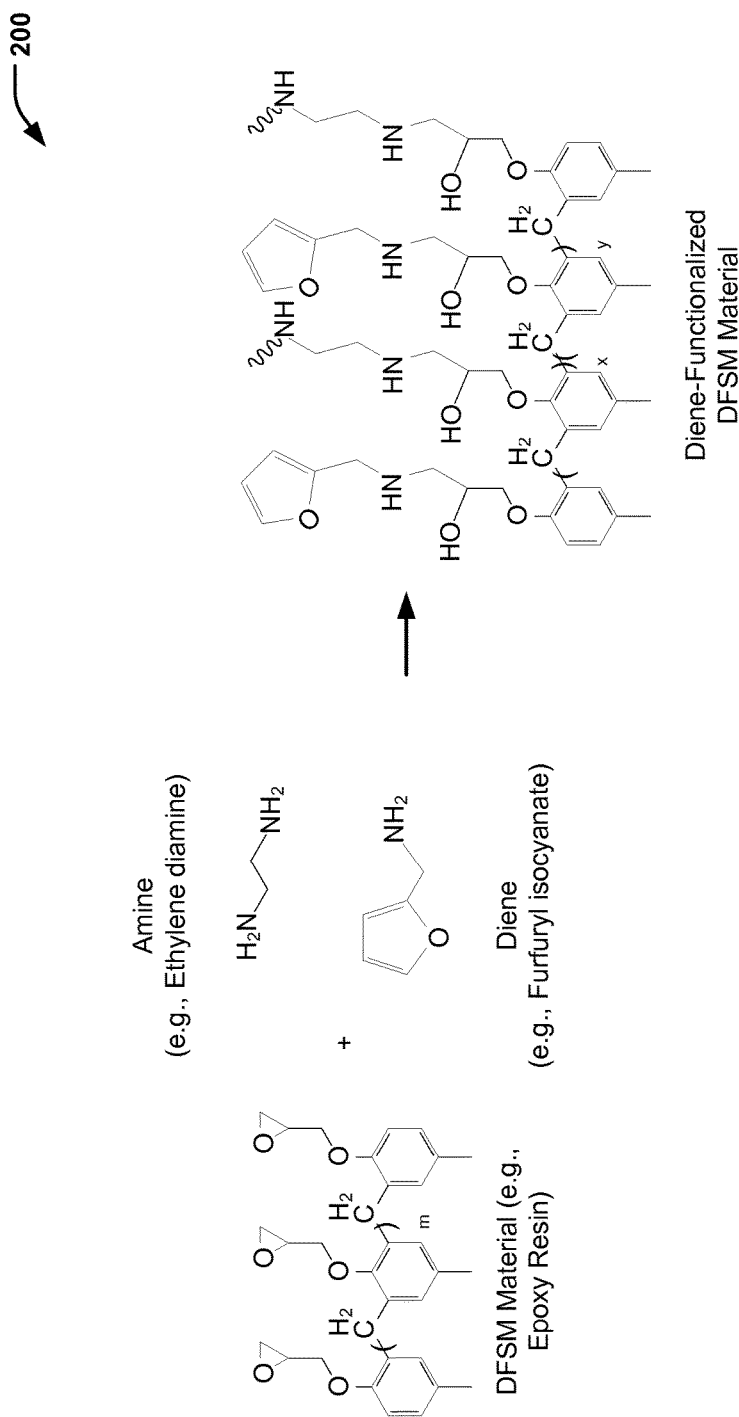
FIG. 2 is a chemical reaction diagram showing the preparation of a diene-functionalized DFSM material for use in forming the DFSM composite laminate material of FIG. 1, according to one embodiment.

FIG. 2 is a chemical reaction diagram 200 showing the preparation of a diene-functionalized DFSM material, according to one embodiment. As illustrated and further described herein with respect to FIG. 1, a diene functional group of the diene-functionalized DFSM material produced according to the process illustrated in FIG. 2 may be reacted with a dienophile functional group of the dienophile-functionalized PCB laminate material (as illustrated and further described herein with respect to FIG. 3) in order to form the DFSM composite laminate material having the DFSM material (reversibly) bonded to the PCB laminate material.

FIG. 2 illustrates a particular example in which a DFSM material (e.g., an epoxy resin) may be chemically reacted with an amine and a diene to form a (partially) diene-functionalized DFSM material. In the example of FIG. 2, ethylene diamine is an example of an amine, and furfuryl isocyanate is an example of a material that is used to provide the diene functionality. Other DFSM material(s), amine(s), and/or diene(s) may be selected by those skilled in the art.

FIG. 2 illustrates, via a first integer m, that the DFSM material may include multiple repeating epoxy units. FIG. 2 further illustrates, via a second integer x and a third integer y, that a first portion of the epoxy units of the DFSM material may be modified via chemical reaction with the amine (e.g., ethylene diamine) and that a second portion of the epoxy units of the DFSM material may be modified via chemical reaction with the diene (e.g., furfuryl isocyanate), respectively. In some cases, a degree of diene functionalization may be determined based on a functionalization threshold in order to allow for a sufficient number of epoxides to bond epoxy layers together. To illustrate, in a particular embodiment, a degree of diene functionalization of the DFSM material (represented by the y integer) may be in a range of about 1 to about 50 percent of the epoxy units (represented by the m integer), such as in a range of about 5 to about 40 percent of the epoxy units, in a range of about 10 to about 30 percent of the epoxy units, or in a range of about 15 to about 25 percent, among other alternatives.

Prophetic Example: Synthesis of Diene-Functionalized DFSM Material

As a prophetic example, an epoxy resin (e.g. EPON Resin 162) (20 g) is added along with ethylene diamine (about 6 molar equivalents), furan-2-ylmethanamine (about 4 molar equivalents), methanol (50 mL) to a round-bottom flask, and a magnetic stir bar is added to the round-bottom flask. The mixture is then heated to about 45° C. and allowed to stir for about 24 hours. The diene-functionalized epoxy resin is then purified using methods known to those skilled in the art. The newly formed diene-functionalized epoxy resin can then be processed into a dry solder film mask by methods known to those skilled in the art.

Figure 3:
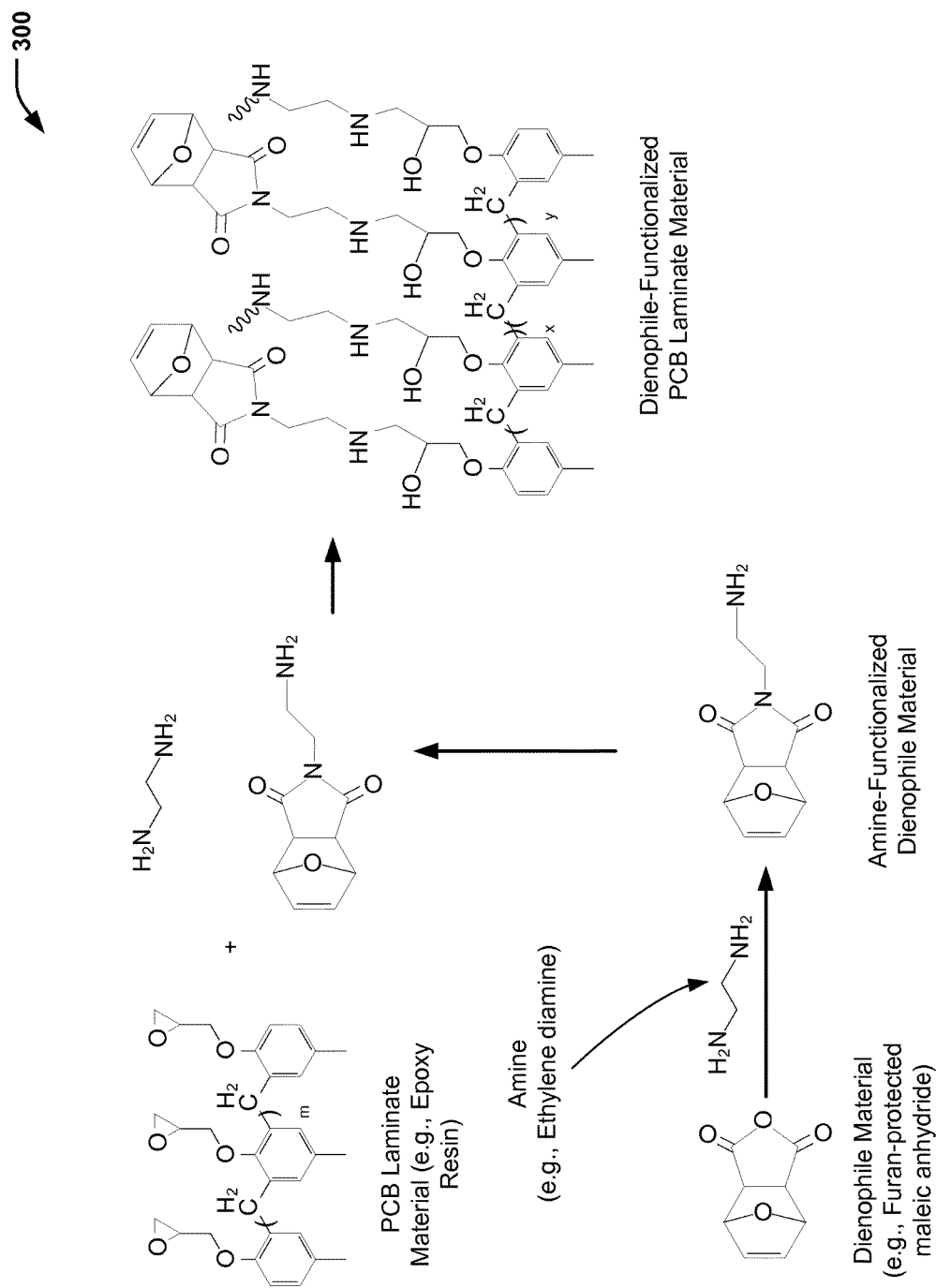
FIG. 3 is a chemical reaction diagram showing the preparation of a dienophile-functionalized printed circuit board (PCB) laminate material for use in forming the DFSM composite laminate material of FIG. 1, according to one embodiment.

Thus, FIG. 2 illustrates a particular embodiment of a process of functionalizing a DFSM material (e.g., an epoxy resin) to include a diene functional group for reaction with a dienophile functional group of a dienophile-functionalized PCB laminate material (e.g., another epoxy resin) that may be formed as described further herein with respect to FIG. 3. As illustrated and further described herein with respect to FIG. 1, a composite DFSM laminate material (e.g., two epoxy layers) may be formed via a chemical reaction of the diene functional group of the functionalized DFSM material with the dienophile functional group of the functionalized PCB laminate material.

FIG. 3 is a chemical reaction diagram 300 showing the preparation of a dienophile-functionalized PCB laminate material, according to one embodiment. As illustrated and further described herein with respect to FIG. 1, the diene functional group of the diene-functionalized DFSM material produced according to the process illustrated in FIG. 2 may be reacted with a dienophile functional group of the dienophile-functionalized PCB laminate material produced according to the process illustrated in FIG. 3 in order to form the DFSM composite laminate material having the DFSM material (reversibly) bonded to the PCB laminate material. In a first chemical reaction shown in FIG. 3 (at the bottom left of FIG. 3), a dienophile material is chemically reacted with an amine to form an amine-functionalized dienophile material. FIG. 3 further illustrates another chemical reaction (at the top of FIG. 3), in which a PCB laminate material is reacted with an amine and the amine-functionalized dienophile material to form a (partially) dienophile-functionalized PCB laminate material.

In the first chemical reaction illustrated in the example of FIG. 3, a dienophile material (e.g., a furan-protected maleic anhydride) is chemically reacted with an amine (e.g., ethylene diamine) to form an amine-functionalized dienophile material (e.g., 2-(2-aminoethyl)-3a,4,7,7a-tetrahydro-1H-4,7-epoxyisoindole-1,3(2H)-dione). In the example of FIG. 3, 3,6-epoxy-1,2,3,6-tetrahydrophthalic anhydride is an example of the dienophile material, and ethylene diamine is an example of the amine. Other dienophile material(s) and/or amine(s) may be selected by those skilled in the art.

FIG. 3 illustrates that the chemical reaction of the amine functional group with the dienophile material (e.g., the furan protected maleic anhydride) results in replacement of oxygen with nitrogen to form a strained furan. Thus, the dienophile functional group of the amine-functionalized dienophile material of FIG. 2 is in protected form. The protected maleic anhydride may be de-protected when heated to a particular temperature. For the Diels-Alder chemistry illustrated in FIG. 1, the furan is removed when heated (e.g., above about 125° C.), as shown on the left side of the chemical reaction diagram 100 of FIG. 1.

Prophetic Example: Synthesis of an Amine-Functionalized Dienophile Material (e.g., 2-(2-aminoethyl)-3a,4,7,7a-tetrahydro-1H-4,7-epoxyisoindole-1,3(2H)-Dione)

To a 100 mL round-bottom flask, exo-3,6-Epoxy-1,2,3,6-tetrahydrophthalic anhydride (0.99 g, $5.96 \times 10^{-3}$ mol), toluene (50 mL), and a magnetic stir bar are added. The mixture is then stirred followed by the addition of ethylene diamine (0.72 g, $1.19 \times 10^{-2}$ mol). The reaction is then attached to a condenser and purged under argon. The solution is then heated to about 45° C. and allowed to stir for about 18 hours. After the reaction, toluene is removed to yield product.

In the second chemical reaction illustrated in FIG. 3 (at the top of FIG. 3), a PCB laminate material is chemically reacted with an amine and a material that is used to provide the dienophile functionality. In the example of FIG. 3, an epoxy resin is an example of the PCB laminate material, 2-(2-aminoethyl)-3a,4,7,7a-tetrahydro-1H-4,7-epoxyisoindole-1,3(2H)-dione is an example of the material that is used to provide the dienophile functionality, and ethylene diamine is an example of the amine. Other PCB laminate material(s), dienophile material(s), and/or amine(s) may be selected by those skilled in the art.

Prophetic Example: Synthesis of a Dienophile-Functionalized PCB Laminate Material (e.g., a Dienophile-Functionalized Epoxy Resin)

In a prophetic example, an epoxy resin (e.g. EPON Resin 162) (20 g) along with ethylene diamine (about 6 molar equivalents), 2-(2-aminoethyl)-3a,4,7,7a-tetrahydro-1H-4,7-epoxyisoindole-1,3(2H)-dione (about 4 molar equivalents), and methanol (50 mL) are added to a round-bottom flask, and a magnetic stir bar is added to the round-bottom flask. The mixture is then heated to about 45° C. and allowed to stir for about 24 hours. The dienophile-modified epoxy resin is then purified using methods known to those skilled in the art. After purification, the maleic anhydride is removed via heating of the resin and further purified. The resulting product is a dienophile-modified epoxy resin that can be used in printed circuit board manufacturing.

FIG. 3 illustrates, via a first integer m, that the PCB laminate material may include multiple repeating epoxy units. FIG. 3 further illustrates, via a second integer x and a third integer y, that a first portion of the epoxy units of the PCB laminate material may be modified via chemical reaction with the amine (e.g., ethylene diamine) and that a second portion of the epoxy units of the PCB laminate material may be modified via chemical reaction with the amine-functionalized dienophile material (e.g., 2-(2-aminoethyl)-3a,4,7,7a-tetrahydro-1H-4,7-epoxyisoindole-1,3(2H)-dione, respectively. In some cases, a degree of dienophile functionalization may be determined based on a functionalization threshold in order to allow for a sufficient number of epoxides to bond epoxy layers together. To illustrate, in a particular embodiment, a degree of dienophile functionalization of the PCB laminate material (represented by the y integer) may be in a range of about 1 to about 50 percent of the epoxy units (represented by the m integer), such as in a range of about 5 to about 40 percent of the epoxy units, in a range of about 10 to about 30 percent of the epoxy units, or in a range of about 25 to about 35 percent of the epoxy units, among other alternatives.

Thus, FIG. 3 illustrates a particular embodiment of a process of functionalizing a PCB laminate material (e.g., an epoxy resin) to include a dienophile functional group for reaction with a diene functional group of a diene-functionalized DFSM material (e.g., the diene-functionalized DFSM material of FIG. 2). As illustrated and further described herein with respect to FIG. 1, a composite DFSM laminate material (e.g., two epoxy layers) may be formed via a chemical reaction of the dienophile functional group of the functionalized PCB material with the diene functional group of the functionalized DFSM material.

Figure 4:
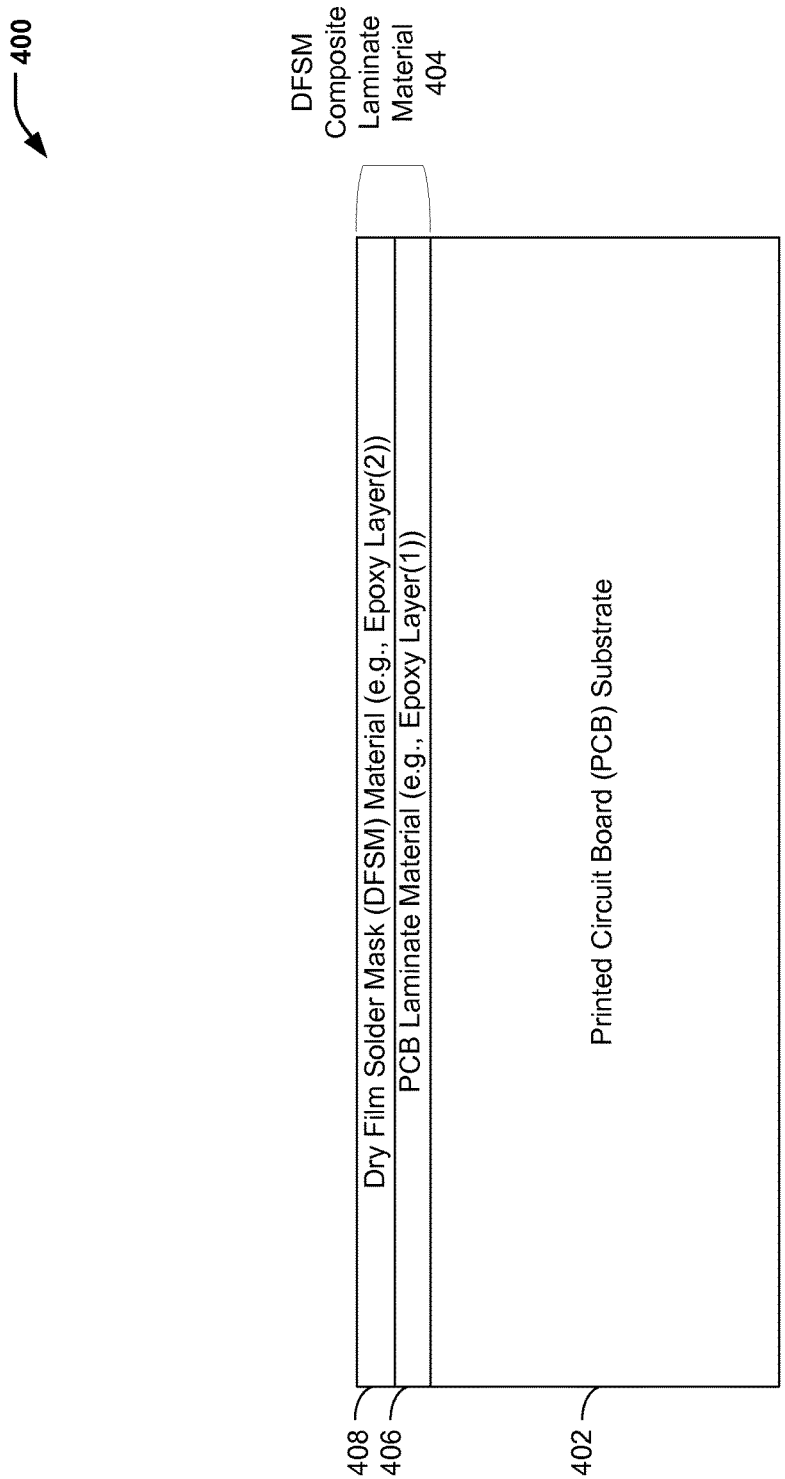
FIG. 4 is a block diagram illustrating an example of a printed circuit board that includes a PCB substrate and a DFSM composite laminate material overlying the PCB substrate, according to one embodiment.

Referring to FIG. 4, a diagram of a particular embodiment of a printed circuit board including a composite DFSM laminate material is illustrated and generally designated 400. In a particular embodiment, as described further herein with respect to FIG. 5, the printed circuit board 400 of FIG. 4 may be formed by applying (e.g., vacuum laminating) a DFSM composite laminate material (e.g., the DFSM composite laminate material of FIG. 1) to a PCB substrate.

In the particular embodiment illustrated in FIG. 4, the printed circuit board 400 includes a PCB substrate 402 and a DFSM composite laminate material 404 overlying the PCB substrate 402. The DFSM composite laminate material 404 includes a PCB laminate material 406 (e.g., an epoxy resin, identified as "Epoxy Layer(1)" in FIG. 4) and a DFSM material 408 (e.g., an epoxy resin, identified as "Epoxy Layer(2)" in FIG. 4). FIG. 4 illustrates that the PCB laminate material 406 is bonded to a surface of the PCB substrate 402, and the DFSM material 108 is bonded to the PCB laminate material 406. In the particular embodiment illustrated in FIG. 4, a single DFSM composite laminate material 404 overlies a "top" surface of the PCB substrate 402. Alternatively or additionally, the DFSM composite laminate material 404 may be disposed on another surface of the PCB substrate 402 (e.g., a "bottom" surface of the PCB substrate 402).

While not shown in FIG. 4, the DFSM material 408 may be reversibly bonded to the PCB laminate material 406 via a cyclic compound. As an example, the cyclic compound that reversibly bonds the DFSM material 408 to the PCB laminate material 406 may include a bicyclic compound that is formed via a Diels-Alder reaction, as illustrated and further described herein with respect to FIG. 1.

Thus, FIG. 4 illustrates a particular embodiment of a printed circuit board having a DFSM composite laminate material bonded to a surface of a PCB substrate. Further, while not shown in FIG. 4, the DFSM material of the DFSM composite laminate material may be reversibly bonded to the PCB laminate material (e.g., via a cyclic compound formed via a Diels-Alder reaction). As described further herein with respect to FIG. 6, the reversible nature of the chemical reaction may allow the DFSM material to be removed from the printed circuit board via a non-aggressive technique (e.g., via a retro Diels-Alder reaction) and reworked (e.g., before or after vacuum lamination of the DFSM composite laminate material to the PCB substrate).

Figure 5:
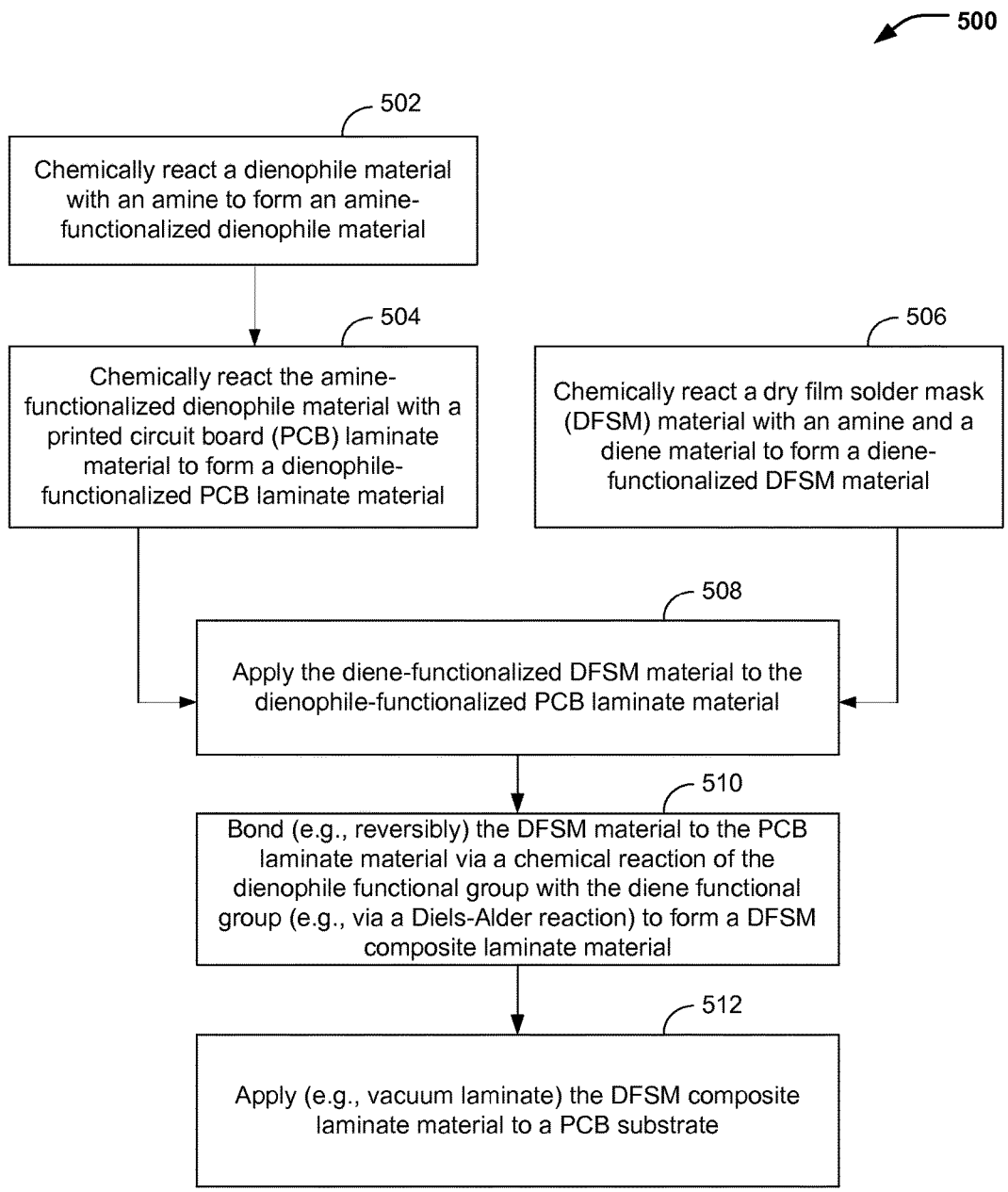
FIG. 5 is a flow diagram showing a particular embodiment of a method of forming a DFSM composite laminate material for application to a printed circuit board.

FIG. 5 is a flow diagram of a particular embodiment of a method 500 of forming a DFSM composite laminate material for application to a printed circuit board (e.g., via vacuum lamination to a PCB substrate). FIG. 5 illustrates an example of a process of producing a DFSM material that includes a diene functional group (as shown in FIG. 1 and further described herein with respect to FIG. 2). FIG. 5 also illustrates an example of a process of producing a PCB laminate material that includes a dienophile functional group (as shown in FIG. 1 and further described herein with respect to FIG. 3). FIG. 5 further illustrates that the diene-functionalized DFSM material may be applied to the dienophile-functionalized PCB laminate material, and the DFSM material may be bonded to the PCB laminate material via a chemical reaction of the diene functional group with the dienophile functional group to form a composite DFSM laminate material. In the particular embodiment illustrated in FIG. 5, the DFSM composite laminate material may be applied (e.g., vacuum laminated) to a PCB substrate of a printed circuit board (as illustrated and further described herein with respect to FIG. 4).

In the particular embodiment illustrated in FIG. 5, operations associated with an example process of producing a dienophile-functionalized PCB laminate material are identified as operations 502-504, while operations associated with producing a diene-functionalized DFSM material are illustrated as operation 506. It will be appreciated that the operations shown in FIG. 5 are for illustrative purposes only and that the chemical reactions may be performed in alternative orders, at alternative times, by a single entity or by multiple entities, or a combination thereof. As an example, one entity (e.g., a first specialty chemical manufacturer) may produce the dienophile-functionalized PCB laminate material, while another entity (e.g., a second specialty chemical manufacturer) may produce the diene-functionalized DFSM material. Further, alternative or additional entities may perform the operations associated with forming the DFSM composite laminate material by bonding the DFSM material to the PCB laminate material via the chemical reaction of the diene functional group with the dienophile functional group (illustrated as operations 508 and 510). In addition, alternative or additional entities (e.g., a printed circuit board manufacturer) may perform the operations associated with applying (e.g., vacuum laminating) the DFSM composite laminate material to a PCB substrate (illustrated as operation 512).

The method 500 includes chemically reacting a dienophile material with an amine to form an amine-functionalized dienophile material, at 502. For example, referring to the first chemical reaction illustrated in FIG. 3 (at the bottom left of FIG. 3), the dienophile material (e.g., a furan-protected maleic anhydride, such as 3,6-epoxy-1,2,3,6-tetrahydrophthalic anhydride) may be chemically reacted with the amine (e.g., ethylene diamine) to form the amine-functionalized dienophile material (e.g., 2-(2-aminoethyl)-3a,4,7,7a-tetrahydro-1H-4,7-epoxyisoindole-1,3(2H)-dione).

The method 500 includes chemically reacting the amine-functionalized dienophile material with a PCB laminate material to form a dienophile-functionalized PCB laminate material, at 504. For example, referring to the second chemical reaction illustrated in FIG. 3 (at the top of FIG. 3), the amine-functionalized dienophile material (e.g., 2-(2-aminoethyl)-3a,4,7,7a-tetrahydro-1H-4,7-epoxyisoindole-1, 3(2H)-dione) and the amine (e.g., ethylene diamine) are chemically reacted with the PCB laminate material (e.g., an epoxy resin) to form the dienophile-functionalized PCB laminate material.

The method 500 includes chemically reacting a DFSM material with an amine and a diene material to form a diene-functionalized DFSM material, at 506. For example, referring to FIG. 2, the DFSM material (e.g., an epoxy resin) may be chemically reacted with the amine (e.g., ethylene diamine) and the diene (e.g., furan-2-ylmethanamine) to form the diene-functionalized DFSM material.

The method 500 includes applying the diene-functionalized DFSM material to the dienophile-functionalized PCB laminate material, at 508. For example, referring to FIG. 1, the diene-functionalized DFSM material may be applied to the dienophile-functionalized PCB laminate material.

The method 500 further includes (reversibly) bonding the DFSM material to the PCB laminate material via a chemical reaction of the diene functional group with the dienophile functional group (e.g., via a Diels-Alder reaction) to form a DFSM composite laminate material, at 510. For example, referring to FIG. 1, the DFSM material may be (reversibly) bonded to the PCB laminate material to form the DFSM composite laminate material. As illustrated in the example of FIG. 1, the materials may be reversibly bonded via a cyclic compound that is formed as a result of a chemical reaction of the diene functional group of the diene-functionalized DFSM material with the alkene functional group of the PCB laminate material (e.g., via a Diels-Alder reaction). In the particular embodiment illustrated in FIG. 1, the diene functional group is a cyclic diene functional group, the alkene functional group is a cyclic alkene functional group, and the cyclic compound is a bicyclic compound.

In the particular embodiment illustrated in FIG. 5, the method 500 further includes applying the DFSM composite laminate material to a PCB substrate, at 512. For example, referring to FIG. 4, the DFSM composite laminate material 404 may be applied to the PCB substrate 402. In a particular embodiment, the DFSM composite laminate material 404 may be applied to the PCB substrate 402 via vacuum lamination.

While not shown in the example of FIG. 5, in some cases, the DFSM material may be de-bonded from the PCB laminate material via a retro Diels-Alder reaction. As further described herein with respect to FIG. 6, reversibly bonding the DFSM material to the PCB laminate material may allow the DFSM material to be removed and/or replaced (e.g., in the event of solder mask misalignment).

Thus, FIG. 5 illustrates various operations associated with (reversibly) bonding a DFSM material to a PCB laminate material to form a DFSM composite laminate material. FIG. 5 further illustrates that the DFSM composite laminate material may be applied to a PCB substrate (e.g., via vacuum lamination) of a printed circuit board.

Figure 6:
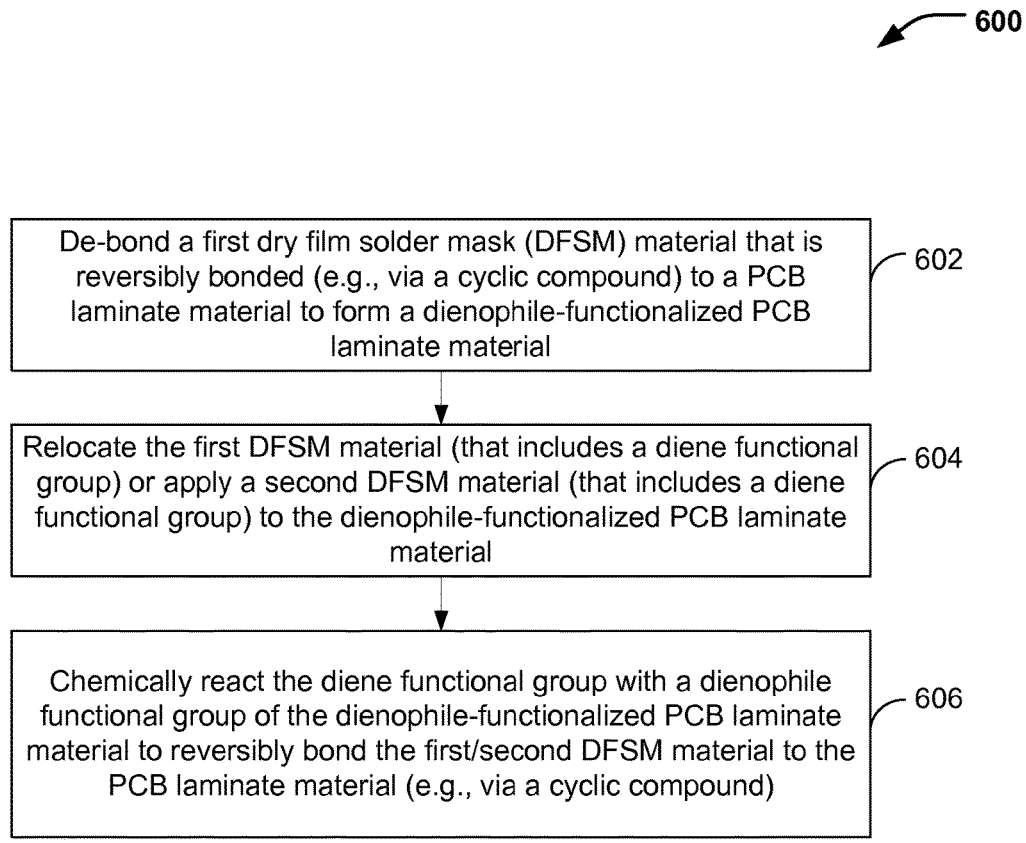
FIG. 6 is a flow diagram showing a particular embodiment of a method of modifying a first DFSM composite laminate material to form a second DFSM composite laminate material for application to a printed circuit board.

FIG. 6 is a flow diagram of a particular embodiment of a method 600 of modifying a DFSM composite laminate material by de-bonding a first DFSM material that is reversibly bonded to a PCB laminate material. In some cases, the first DFSM material may be misaligned with respect to a PCB substrate, and de-bonding the first DFSM material may allow for relocation of the first DFSM material. In other cases, there may be a desire to replace/repair the first DFSM material, and de-bonding the first DFSM material may allow for application of a second DFSM material.

The method 600 includes de-bonding a first DFSM material that is reversibly bonded to a PCB laminate material to form a dienophile-functionalized PCB laminate material, at 602. As an example, referring to FIG. 1, a retro Diels-Alder reaction may de-bond the DFSM material from the DFSM composite laminate material to form the dienophile-functionalized PCB laminate material (e.g., an epoxy material). In the example of FIG. 1, the DFSM material is reversibly bonded to the PCB laminate material via a first cyclic compound (e.g., a bicyclic compound) that is formed via the forward reaction (e.g., a Diels-Alder reaction). De-bonding the DFSM material from the PCB laminate material (e.g., via a retro Diels-Alder reaction) results in the formation of the diene-functionalized DFSM material and the dienophile-functionalized PCB laminate material, as shown in the reverse reaction of FIG. 1.

The method 600 includes relocating the first DFSM material that includes the diene functional group or applying a second DFSM material that includes a diene functional group to the dienophile-functionalized PCB laminate material, at 604. As an illustrative example, referring to FIG. 4, the DFSM material 408 may be misaligned with respect to the PCB substrate 402 (e.g., before vacuum lamination of the DFSM composite laminate material 404 to the PCB substrate 402). In this case, the DFSM material 408 may be de-bonded from the PCB laminate material 406 via a non-aggressive technique (e.g., a retro Diels-Alder reaction) for subsequent relocation in order to correct the misalignment. As another example, it may be desirable to replace/change a DFSM material in some cases. To illustrate, an entity (e.g., a printed circuit board manufacturer) may desire to replace a first DFSM material with a second DFSM material (e.g., after vacuum lamination of the DFSM composite laminate material). In this case, the second DFSM material may allow the entity to change solder mask material(s) via a non-aggressive technique (e.g., a retro Diels-Alder reaction). As an illustrative example, referring to FIG. 4, the DFSM material 408 may represent a first DFSM material to be de-bonded from the PCB laminate material 406 (e.g., after vacuum lamination of the DFSM composite laminate material 404 to the PCB substrate 402). In this case, the DFSM material 408 may be de-bonded from the PCB laminate material 406, and a second DFSM material (not shown in FIG. 4) may be applied to the PCB laminate material 406 to bond the second DFSM material to the PCB laminate material 406 (e.g., via a Diels-Alder reaction).

The method 600 further includes chemically reacting the diene functional group (of the first DFSM material or the second DFSM material) with a dienophile functional group of the dienophile-functionalized PCB laminate material, at 606. The first/second DFSM material is reversibly bonded to the PCB laminate material via a cyclic compound that is formed as a result of the chemical reaction of the diene functional group with the dienophile functional group. In the case of a relocated first DFSM material, the first DFSM material may be reversibly bonded to the PCB laminate material via a first cyclic compound (e.g., the bicyclic compound illustrated in the example of FIG. 1). In the case of a second DFSM material being applied, the second DFSM material may be reversibly bonded to the PCB laminate material via the first cyclic compound or via a second cyclic compound (e.g., a second bicyclic compound) that is formed as a result of the chemical reaction of the diene functional group with the dienophile functional group of the dienophile-functionalized PCB laminate material.

Thus, FIG. 6 illustrates that the ability to de-bond (e.g., via a retro Diels-Alder reaction) a DFSM material that is reversibly bonded to a PCB laminate material of a DFSM composite laminate material may allow the DFSM material to be reworked without aggressive techniques. In some cases (e.g., in the case of a DFSM material that is misaligned with respect to a PCB substrate), de-bonding the DFSM material may allow for relocation of the DFSM material to correct the misalignment utilizing non-aggressive techniques. In other cases (e.g., when an entity desires to replace the DFSM material), de-bonding the DFSM material from the PCB laminate material allows the DFSM material to be repaired/replaced without utilizing non-aggressive techniques.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. A dry film solder mask (DFSM) composite laminate material comprising:
a printed circuit board (PCB) laminate material comprising a dienophile functional group;
a cyclic compound chemically bonded to the PCB laminate material; and
a dry film solder mask (DFSM) material comprising a diene functional group, wherein the DFSM material is reversibly bonded to the PCB laminate material via the cyclic compound, the cyclic compound formed from a chemical reaction of the diene functional group and the dienophile functional group.

2. The DFSM composite laminate material of claim 1, wherein the cyclic compound is formed via a Diels-Alder reaction.

3. The DFSM composite laminate material of claim 2, wherein the cyclic compound includes a bicyclic compound that is formed as a result of chemical reaction of a cyclic alkene compound and a cyclic diene compound.

4. The DFSM composite laminate material of claim 1, wherein the PCB laminate material is bonded to a surface of a PCB substrate.

5. The DFSM composite laminate material of claim 1, wherein the DFSM material includes a first polymeric material.

6. The DFSM composite laminate material of claim 5, and wherein the PCB laminate material includes a second polymeric material.

7. The DFSM composite laminate material of claim 6, wherein the first polymeric material includes a first epoxy resin material, and wherein the second polymeric material includes a second epoxy resin material.

8. A printed circuit board comprising:
a printed circuit board (PCB) substrate; and
a dry film solder mask (DFSM) composite laminate material overlying the PCB substrate, wherein the DFSM composite laminate material includes:
a PCB laminate material bonded to a surface of the PCB substrate, the PCB laminate material comprising a dienophile functional group;
a cyclic compound chemically bonded to the PCB laminate material; and
a DFSM material comprising a diene functional group, wherein the DFSM material is reversibly bonded to the PCB laminate material via the cyclic compound, the cyclic compound formed from a chemical reaction of the diene functional group and the dienophile functional group.

9. The printed circuit board of claim 8, wherein the PCB laminate material includes a first epoxy layer overlying the surface of the PCB substrate, and wherein the DFSM material includes a second epoxy layer that overlies the first epoxy layer.

10. The printed circuit board of claim 8, wherein the DFSM composite laminate material is vacuum laminated to the PCB substrate.

11. The printed circuit board of claim 8, wherein the cyclic compound is formed via a Diels-Alder reaction.

12. The printed circuit board of claim 11, wherein the cyclic compound includes a bicyclic compound that is formed as a result of chemical reaction of a cyclic alkene compound and a cyclic diene compound.

13. A dry film solder mask (DFSM) composite laminate material comprising:
a printed circuit board (PCB) laminate material comprising a diene functional group;
a cyclic compound chemically bonded to the PCB laminate material; and
a dry film solder mask (DFSM) material comprising a dienophile functional group, wherein the DFSM material is reversibly bonded to the PCB laminate material via the cyclic compound, the cyclic compound formed from a chemical reaction of the diene functional group and the dienophile functional group.

14. The DFSM composite laminate material of claim 13, wherein the cyclic compound is formed via a Diels-Alder reaction.

15. The DFSM composite laminate material of claim 14, wherein the cyclic compound includes a bicyclic compound that is formed as a result of chemical reaction of a cyclic alkene compound and a cyclic diene compound.

16. The DFSM composite laminate material of claim 13, wherein the PCB laminate material is bonded to a surface of a PCB substrate.

17. The DFSM composite laminate material of claim 13, wherein the DFSM material includes a first polymeric material.

18. The DFSM composite laminate material of claim 17, and wherein the PCB laminate material includes a second polymeric material.

19. The DFSM composite laminate material of claim 18, wherein the first polymeric material includes a first epoxy resin material, and wherein the second polymeric material includes a second epoxy resin material.

\* \* \* \* \*